United States Patent [19]
Min et al.

[11] Patent Number: 5,270,239
[45] Date of Patent: Dec. 14, 1993

[54] METHOD FOR MANUFACTURING A DYNAMIC RANDOM ACCESS MEMORY CELL

[75] Inventors: Wi S. Min, Seoul; Jae K. Kim, Kyoung Ki, both of Rep. of Korea

[73] Assignee: Hyundai Electronics Industries Co., Ltd., Kyoung Ki, Rep. of Korea

[21] Appl. No.: 932,704

[22] Filed: Aug. 19, 1992

[30] Foreign Application Priority Data

Aug. 21, 1991 [KR] Rep. of Korea .................... 91-14375

[51] Int. Cl.⁵ ............................................. H01L 21/70
[52] U.S. Cl. .......................................... 437/52; 437/47; 437/60; 437/919
[58] Field of Search ...................... 437/38, 47, 48, 52, 437/60, 919; 257/302, 309

[56] References Cited

U.S. PATENT DOCUMENTS

| | | | |
|---|---|---|---|
| 4,920,065 | 4/1990 | Chim et al. | 437/919 |
| 5,001,078 | 3/1991 | Wada | 437/919 |
| 5,068,200 | 11/1991 | Kang et al. | 437/52 |
| 5,106,775 | 4/1992 | Kaga et al. | 437/919 |
| 5,162,250 | 11/1992 | Clark | 437/919 |

FOREIGN PATENT DOCUMENTS 1-152660 6/1989 Japan .
248557 10/1989 Japan .................................. 257/302

Primary Examiner—Tom Thomas
Attorney, Agent, or Firm—Merchant, Gould, Smith, Edell, Welter & Schmidt

[57] ABSTRACT

A method for manufacturing a DRAM Cell of a highly integrated semiconductor device is disclosed. In order to realize a high integration using a DRAM cell, a projection having a non-etched part of a substrate is formed on the predetermined area of a substrate and a gate oxide layer and a gate electrode are formed on the side wall around the projection. A source electrode is formed on the upper part of the projection. A drain electrode is formed on the substrate that surrounds the lower part of the projection. An intermediate insulating layer is formed on the upper part of the lower substrate and the gate electrode. A charge storage electrode that is connected to the source electrode of the projection is formed in such a way that it encompasses the projection. A dielectric layer is formed on the upper part of the charge storage electrode. A plate electrode is formed on the upper part of the dielectric layer.

6 Claims, 5 Drawing Sheets

METHOD FOR MANUFACTURING A DYNAMIC RANDOM ACCESS MEMORY CELL

BACKGROUND OF THE INVENTION

1. Field of the Invention

The invention relates to a method for manufacturing a DRAM cell, and more particularly to a method for manufacturing a DRAM cell used to realize a high integration of the semiconductor device by forming a stacked capacitor around a projection after manufacturing a semiconductor substrate having a projection.

2. BACKGROUND OF THE INVENTION

Generally, a DRAM cell consists of one capacitor and one transistor. That is, A DRAM cell has a MOSFET where a channel region parallel to the surface of a semiconductor substrate is formed. On the upper part of said MOSFET, a stacked capacitor is formed and connected to a source electrode of the MOSFET. On the upper part of said stacked capacitor, a bit line is formed and connected to a drain electrode of the MOSFET.

In order to realize a high integration of the DRAM cell, the area occupied by an unit cell must be reduced. However, the ability to reduce the area occupied by the capacitor to secure the required capacitance is limited. Also, the width of gate electrode can not be reduced further once it reaches a certain size because of the channel effect. It is clear that, with the structure of the conventional DRAM cell, the area occupied by the DRAM cell can be reduced only to a certain extent since a certain sized area is required when connecting a charge storage electrode or bit line onto a semiconductor substrate.

In FIG. 1, a cross-sectional view of the structure of the conventional vertical DRAM cell is given. The conventional vertical DRAM cell is made up of a p-type silicon island 122 formed on a p-type silicon substrate 121, a highly doped n-type impurity diffusion layer 116, a word line 117 that is used as a gate electrode, a gate insulator 107, and a highly doped n-type impurity diffusion layer 112. Also, a charge storage device is formed with a highly doped n-type impurity diffusion layer 112, a capacitor insulator 103, and a plate electrode 113.

However, a capacitor area of the conventional vertical DRAM cell needed to secure the required capacitance can be reduced only to a certain size and no more.

SUMMARY OF THE INVENTION

Accordingly, the object of this invention is to provide a method for manufacturing a DRAM cell used to realize a high integration by modifying the structure of the conventional DRAM cell thus solving the problems mentioned previously.

The method for manufacturing a dynamic random access memory cell with a stacked capacitor around a projection of the present invention defined by the claims with a specific embodiment shown in the attached drawings.

For the purpose of summarizing the invention, an embodiment of the invention relates a method for manufacturing a DRAM cell of a highly integrated semiconductor device, where, a semiconductor substrate is provided and a projection is formed by etching a pre-designated portion after coating a photo resist layer on the upper part of said substrate.

Next, a field oxide layer is formed on the desired portion of the substrate;

sequentially a gate oxide layer and a conductive layer for a gate electrode are formed on the lower part of the substrate and the surface of said projection and then a gate electrode on the side wall of the projection is formed by etching out the conductive layer for the gate electrode by an anisotropic etching process.

Next, a source electrode on the upper part of the projection and a drain electrode on the lower part of the substrate are formed respectively by doping an impurity of different type from that of the substrate.

An intermediate insulating layer is formed the upper part of the whole structure at the predetermined thickness and then, a photo resist layer is coated smoothly on its upper part, here, the photo resist layer must be coated so that it is thicker than the height of the intermediate insulating layer of the upper part of the projection and the photo resist layer and intermediate insulating layer which is its lower part are etched out so that the source electrode of the projection is exposed.

A conductive layer for the charge storage electrode is formed on the upper part of the whole structure at the predetermined thickness and then, a first charge storage electrode that is connected selectively to the intermediate insulating layer of upper part of said projection via an etching process that uses the first charge storage electrode mask is formed.

A conductive layer for the second charge storage electrode is formed on the whole structure that includes the first charge storage electrode is formed and then, the second conductive layer for charge storage electrode is anisotrophically etch out so that it is selectively left on the intermediate insulating layer of the side wall of the projection to form the second charge storage electrode that is connected to the first charge storage electrode.

Finally, a dielectric layer on the upper part of said first and second charge storage electrodes is formed and then, a plate electrode is formed on its upper part.

The more practical and important features of the present invention have been outlined above in order that the detailed description of the invention which follows will be better understood and the present contribution to the art can be fully appreciated. Additional features of the invention described here in after also form the subject matter of the claims of the invention. Those skilled in the art can appreciate that the conceptions and the specific embodiment disclosed herein may be readily utilized as bases for modifying or designing other structures for carrying out the same purposes as those of the present invention. Further, those skilled in the art can realize that such equivalent constructions do not depart from the spirit and scope of the invention as set forth in the claims.

BRIEF DESCRIPTION OF THE DRAWING

For a fuller understanding of the nature and object of the invention, reference should be made to the following Detailed Description of the Invention in conjuction with the accompanying drawings, in which.

Similar reference numbers refer to similar parts throughout the several view of the drawings.

DETAILED DESCRIPTION OF THE INVENTION

Figure 1:
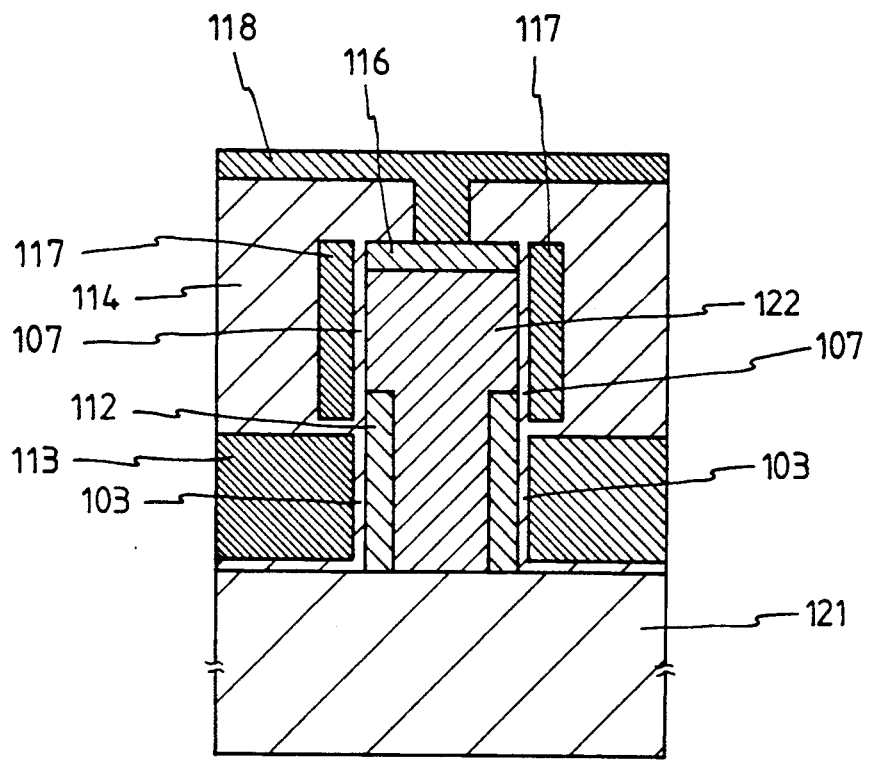
FIG. 1 illustrates a cross sectional view of the conventional Vertical DRAM cell.

FIG. 1 is a cross sectional view of the conventional vertical DRAM Cell. Since it had been already explained, no more explanation is given.

FIG. 2 through FIG. 9 show cross-sectional views that depict the process steps for manufacturing the DRAM cell using the manufacturing method of present invention.

Figure 2:
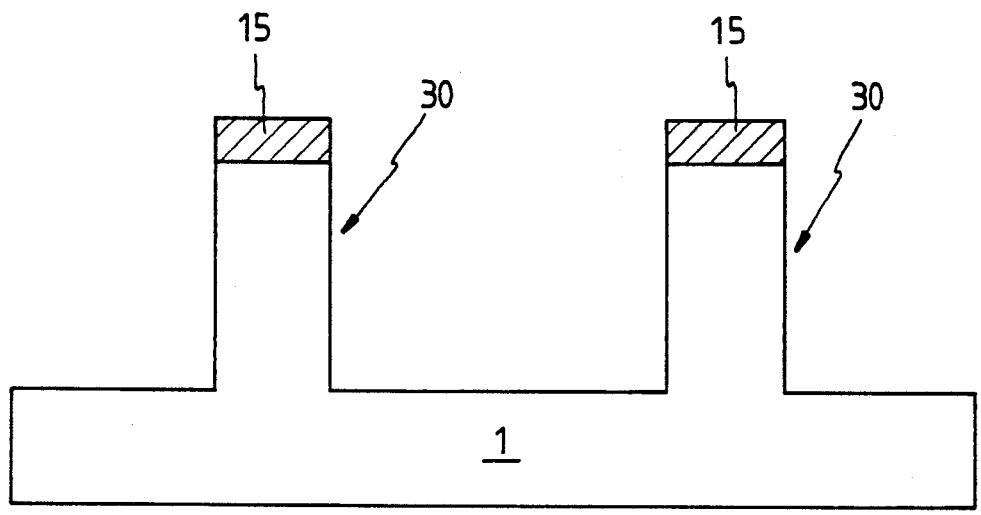
FIG. 2 through FIG. 9 are cross-sectional views that depict each manufacturing process of the DRAM cell of the present invention.

Referring to FIG. 2, a photo resist layer 15 is coated on the upper part of a semiconductor substrate 1. Then, a photo resist layer 15 except the photo resist layer coated on a predetermined area is removed using a projection mask. Next, a projection is formed by etching out an exposed substrate 1 to the depth of 7000 Å-15000 Å via an etching process. The height of the projection 30 can vary according to the channel length of the MOSFET and the capacity of the capacitor.

Figure 3:
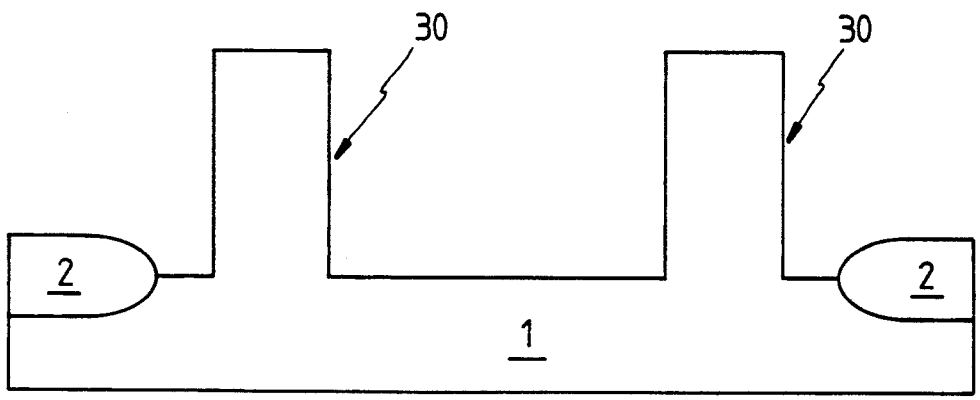

Referring to FIG. 3, the remaining photo resist layer on the projection 30 is completely removed. Then, a field oxide layer 2 is formed on the predetermined area of the substrate 1 by the local oxidation of silicon (LOCOS) process.

Figure 4:
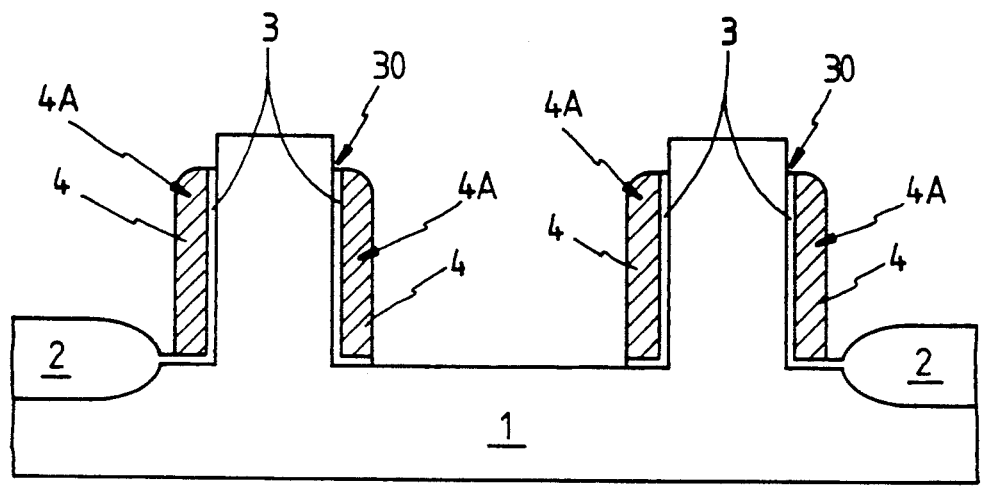

Referring to FIG. 4, a gate oxide layer 3 is formed on the surface of the substrate 1. Then, a conductive layer 4 for the gate electrode is formed on the gate oxide layer 3. Next, the conductive layer 4 for the gate electrode is over-etched via an anisotropic etching thus forming a gate electrode 4A on the side wall of the projection 30. As a result, the conductive layer 4 for the gate electrode is removed up to a certain height below the height of the top surface by said over etching.

Figure 5:
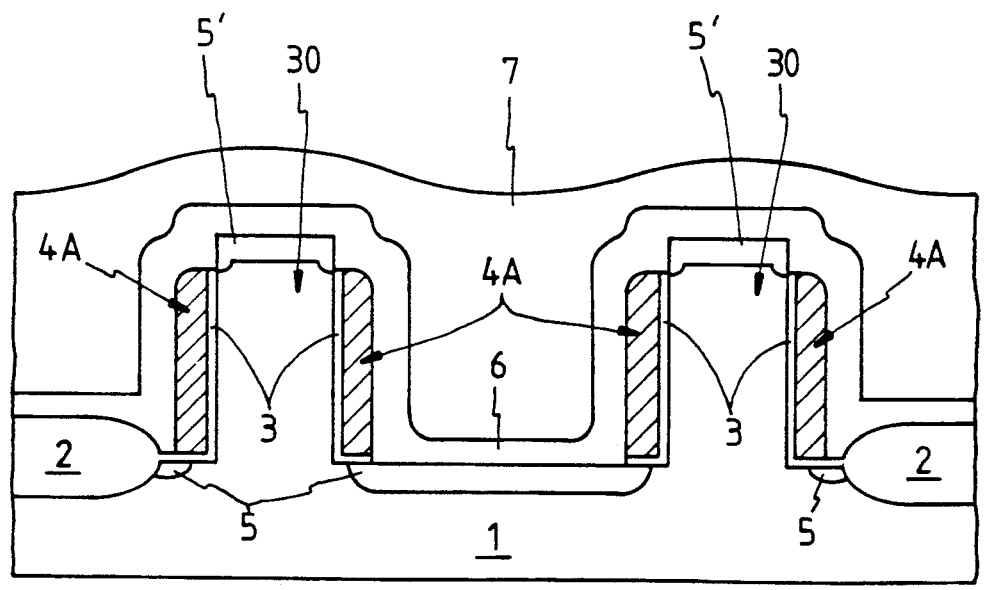

Referring to FIG. 5, a source electrode 5' and drain electrode 5 are formed by doping an impurity of different type from that of the substrate 1 on the upper part of the projection 30 and on the substrate exposed by the above over-etching process. Then, an intermediate insulating layer 6 is formed on the upper part of the whole structure in predetermined thickness. Finally, a photo resist layer 7 is formed smoothly in such a way that it is thicker than the upper surface of an intermediate insulating layer 6 located on the upper part of the projection 30.

Figure 6:
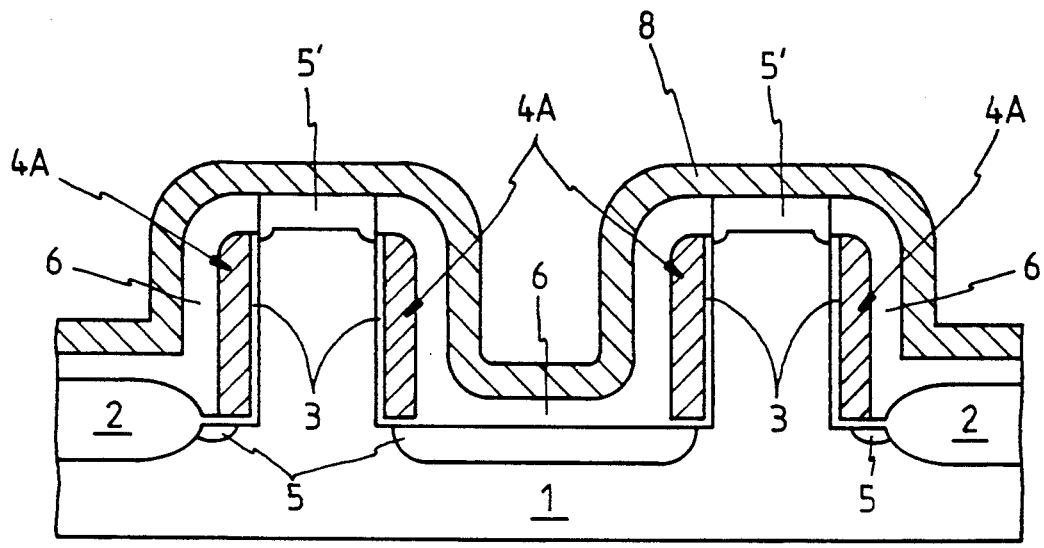

Referring to FIG. 6, said photo resist layer 7 and the intermediate insulating layer 6 are etched at the same time with an etch back process so that the source electrode 5' on the upper part of the projection 30 is exposed. At this time, the etching selectivity ratio between the said photo resist layer 7 and intermediate insulating layer 6 should be about 1:3 through 3:1 and the gate electrode 4A should be completely covered by the intermediate insulating layer 6. Next, said photo resist layer 7 is completely removed and then a conductive layer 8 for the first charge storage electrode is formed in predetermined thickness on the upper part of the whole structure.

Figure 7:
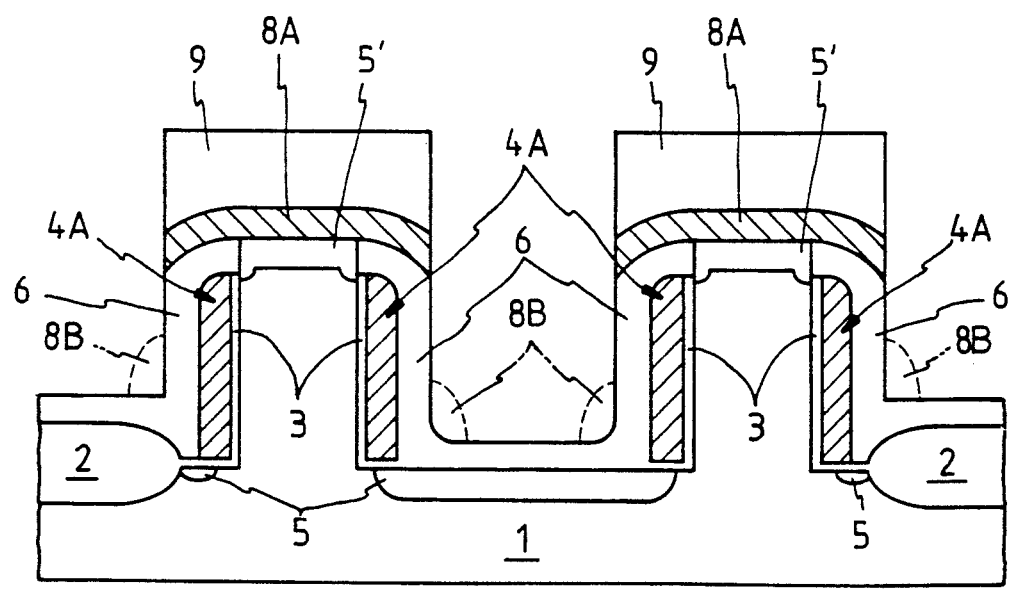

Referring to FIG. 7, a photo resist layer 9 is coated on the upper part of the conductive layer 8 for the first charge storage electrode and then the photo resist layer 9 as much as the width of the intermediate insulating layer 6 located on the upper part of the projection 30 is left on while the rest is removed. Next, the exposed conductive layer 8 for the first charge storage electrode is completely etched by using said photo resist layer 9 as an etching barrier thus forming a first charge storage electrode 8A. It should be noted that spacer 8B of the conductive layer for the first charge storing electrode can be left on the edge of the lower part of the intermediate insulating layer 6 after the etching process. This will not affect the manufacturing process.

Figure 8:
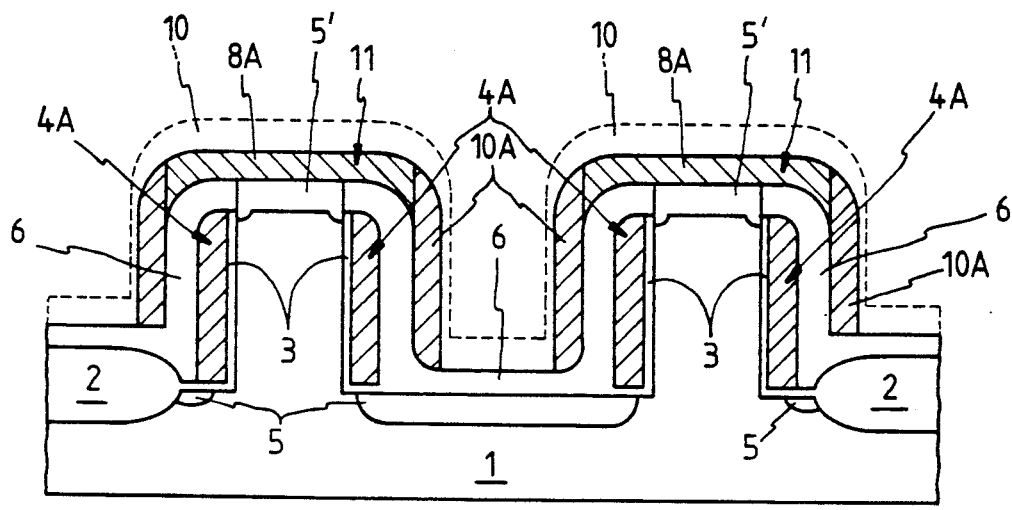

Referring to FIG. 8, the photo resist layer 9 on the upper part of said projection 30 is completely removed and then the conductive layer 10 for the second charge storage electrode is formed in predetermined thickness on the upper part of the whole structure. Next, said conductive layer 10 for the second charge storage electrode is etched out via an anisotropic etching process such that the second charge storage electrode 10A is left only on the intermediate insulating layer 6 of the side wall of the projection 30.

Figure 9:
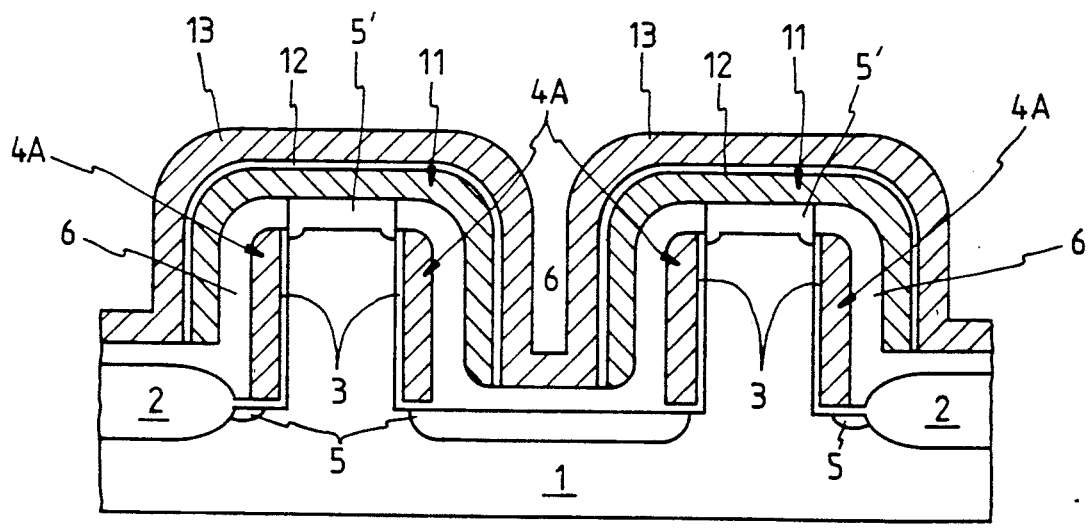

Referring to FIG. 9, a dielectric layer 12 is formed on the upper part of said charge storage electrode 11 and then a plate electrode 13 on the upper part of the dielectric layer 12 and the exposed intermediate insulating layer 6 is formed.

As described above, the MOSFET of the DRAM cell of the present invention forms the projection of the substrate. Also, it forms the gate electrode, the source, and the drain electrode so that the channel region is formed along the side wall of the projection. Finally, it forms the stacked capacitor that encompasses the projection thereby minimizing the area of the unit cell.

Although this invention has been described in its preferred form with a certain degree of particularity, it will be appreciated by those skilled in the art that the present disclosure of the preferred form has been effected only by way of example, and that numerous changes in the details of the construction, combination and arrangement of parts may be resorted to without departing from the spirit and scope of the invention.

What is claimed is:

1. A method for manufacturing a DRAM cell of a highly integrated semiconductor device comprising the steps of:

providing a semiconductor substrate;

forming a projection by etching out a portion of said substrate after coating a first photo resist layer on said substrate; then removing said first photo resist layer;

forming a field oxide layer on a portion of said substrate;

sequentially forming a gate oxide layer and a conductive layer for a gate electrode on the substrate having the projection and then forming a gate electrode on side walls of said projection by etching out the conductive layer for said gate electrode via an anisotropic etching process;

forming a source electrode into the projection and a drain electrode into the substrate respectively by doping an impurity of different type from that of said substrate;

forming an intermediate insulating layer on all the surfaces of the substrate; then coating a second photo resist layer smoothly over said intermediate insulating layer such that the second photo resist layer is thicker than the height of said intermediate insulating layer on said projection;

etching out said second photo resist layer and intermediate insulating layer so that the source electrode of said projection is exposed;

forming a conductive layer for a first charge storage electrode on the intermediate insulating layer and exposed source electrode; then forming the first charge storage electrode that is connected selectively to the intermediate insulating layer and said source electrode on said projection via an etching process that uses a first charge storage electrode mask;

forming a conductive layer for a second charge storage electrode on all the surfaces of the substrate including the first charge storage electrode; then anisotrophically etching out said conductive layer for second charge storage electrode so that it is selectively left on the intermediate insulating layer of the side walls of said projection to form the second charge storage electrode that is connected to the first charge storage electrode;

forming a dielectric layer on said first and second charge electrodes; and then forming a plate electrode on the dielectric layer.

2. The method according to claim 1 wherein said substrate is etched out to a depth of 7000 Å–15000 Å when forming said projection.

3. The method according to claim 1 wherein the etching selectivity ratio between said second photo resist layer and the intermediate insulating layer is 1:3 through 3:1.

4. The method according to claim 1 wherein the height of said projection can be adjusted according to a channel length of MOSFET and capacitance required in each cell.

5. The method according to claim 1 wherein the gate electrode, source electrode, and drain electrode are formed along the side walls of said projection.

6. The method according to claim 1 wherein said conductive layer for the gate electrode is over-etched so that the height of said conductive layer for the gate electrode is lower than that of an upper surface of the projection.

* * * * *